(12) United States Patent
Da Rocha Mordente et al.

(10) Patent No.: US 9,810,323 B2
(45) Date of Patent: Nov. 7, 2017

(54) PISTON RING

(71) Applicants: Mahle International GmbH, Stuttgart (DE); Mahle Metal Leve S/A, Jundiai (BR)

(72) Inventors: Paulo Jose Da Rocha Mordente, Jundiai (BR); Paulo R. Vieira De Morais, São Bernardo do Campo (BR); Jose V. Lima Sarabanda, São Paulo (BR)

(73) Assignees: Mahle International GmbH (DE); Mahle Metal Leve S/A (BR)

( * ) Notice: Subject to any disclaimer, the term of this patent is extended or adjusted under 35 U.S.C. 154(b) by 0 days.

(21) Appl. No.: 14/891,275

(22) PCT Filed: May 15, 2014

(86) PCT No.: PCT/BR2014/000156
§ 371 (c)(1),
(2) Date: Nov. 13, 2015

(87) PCT Pub. No.: WO2014/183180
PCT Pub. Date: Nov. 20, 2014

(65) Prior Publication Data
US 2016/0084380 A1 Mar. 24, 2016

(30) Foreign Application Priority Data
May 15, 2013 (BR) .......... 10 20130121339

(51) Int. Cl.
*F16J 9/20* (2006.01)
*F16J 9/26* (2006.01)
(Continued)

(52) U.S. Cl.
CPC ............. *F16J 9/26* (2013.01); *C23C 14/0641* (2013.01); *F16J 9/14* (2013.01); *F16J 9/203* (2013.01)

(58) Field of Classification Search
CPC . F16J 9/00; F16J 9/12; F16J 9/26; F16J 9/28; C23C 14/06; C23C 14/0617; C23C 14/0641; C23C 14/0658
See application file for complete search history.

(56) References Cited

U.S. PATENT DOCUMENTS 6,149,162 A 11/2000 Tanaka et al.
6,189,893 B1 * 2/2001 Hartmann .................. F16J 9/22
277/443
(Continued)

FOREIGN PATENT DOCUMENTS

DE 102008035148 A1 2/2009
DE 102012002447 A1 11/2012
(Continued)

OTHER PUBLICATIONS

English abstract for JP2000120866.

*Primary Examiner* — Gilbert Lee
(74) *Attorney, Agent, or Firm* — Fishman Stewart PLLC

(57) ABSTRACT

A piston ring may include a metallic base, an outer slide layer and an intermediate layer disposed between the base and the outer slide layer. The base may extend between at least two end regions. The outer slide layer and the intermediate layer may be disposed on an outer radial face of each end region of the base.

18 Claims, 2 Drawing Sheets

(51) Int. Cl.
*F16J 9/14* (2006.01)
*C23C 14/06* (2006.01)

(56) References Cited

U.S. PATENT DOCUMENTS

| | | | |
|---|---|---|---|
| 2002/0004107 | A1 | 1/2002 | Rogers |
| 2004/0056425 | A1 | 3/2004 | Miida |
| 2009/0026711 | A1 | 1/2009 | Urabe et al. |
| 2010/0090416 | A1 | 4/2010 | Tomanik et al. |
| 2010/0117304 | A1* | 5/2010 | Esser .......... F16J 9/26 277/443 |
| 2013/0187340 | A1* | 7/2013 | Esser .......... F16J 9/26 277/442 |
| 2013/0307221 | A1* | 11/2013 | Esser .......... F16J 9/12 277/434 |
| 2014/0364348 | A1* | 12/2014 | Malshe .......... C10M 125/22 508/117 |
| 2015/0010776 | A1* | 1/2015 | Stong .......... C23C 4/10 428/655 |
| 2015/0091255 | A1 | 4/2015 | Issler |

FOREIGN PATENT DOCUMENTS

| | | |
|---|---|---|
| JP | 2000120866 A | 4/2000 |
| WO | WO-2006/131801 A1 | 12/2006 |
| WO | WO-2011/057875 A1 | 5/2011 |
| WO | WO-2012/160138 A1 | 11/2012 |

* cited by examiner

PISTON RING

CROSS-REFERENCE TO RELATED APPLICATIONS

This application claims priority to Brazilian Patent Application No. 1020130121339, filed May 15, 2013, and International Patent Application No. PCT/BR2014/000156, filed May 15, 2014, both of which are hereby incorporated by reference in their entirety.

TECHNICAL FIELD

The present invention relates to a piston ring for use on internal combustion engines, more particularly to a ring provided with a metallic base wherein the external portion of it ends receive two layers applied subsequently to provide greater resistance to wear.

BACKGROUND

As a general rule, every internal combustion engine, whether it operates in Diesel cycle or in Otto cycle, on 2 strokes or 4 strokes, comprises at least one piston with its respective rings.

The piston ring is the part that performs the function of sealing the space between the engine sleeve and the piston, isolating the combustion chamber from the other internal engine components. This element is arranged radially at the piston top, preventing the combustion gases from escaping out of the combustion chamber toward the crankcase and preventing the engine oil from penetrating the combustion chamber on a reverse direction. There may be more than one piston ring surrounding a single piston, and it is very common to use three rings arranged parallelly at the piston top.

Generally, prior-art piston rings 10' comprise an opening between two ends 4', even when they are mounted on the piston and confined by the cylinder, as shown in FIG. 1 of this document. Among other functions, the opening is useful during the installation of the prior-art piston ring 10' around the piston (not shown in the figures). The opening provides access to a tool configured to open the ring 10', enlarging its inner diameter beyond the external radial limits of the piston, thus enabling access thereof to the ring groove, that it, the recess in the outer face of the piston where the ring is housed.

In summary, a piston ring should have good sealing capability, and in order to guarantee this characteristic along the useful life of the engine a piston ring should exhibit adequate mechanical stability, breaking strength, and also adequate resistance to wear with respect to its tribological pairs: the cylinder for its contact face and the piston groove for its side contact faces. Excessive wear of the side faces and of the contact face ends up causing degradation of the sealing main function of the combustion chamber and results in abrupt degradation of the functioning conditions of the engine.

Many of the efforts to provide a solution to wear of piston rings have been directed to the development of coatings and surface treatments that impart better resistance to wear, with a direct impact on the durability of the engine.

Moreover, it is also known that the design of a piston ring (that is, its three-dimensional geometric form) can contribute to a longer useful life of the engine by controlling the wear of the piston rings and providing appropriate pressure distribution, thus providing greater homogeneity of the wear along the peripheral surface, or functional surface of the piston ring.

In terms of wear of piston rings, particularly a compression ring (or first-groove ring), the most affected part of the component is the region of ring surface that is in contact with the cylinder. Throughout this contact surface—hereinafter called outer radial face—there is a specific portion that undergoes even greater wear than the average wear which this outer radial face undergoes: the regions close to the ring ends (called critical zones 1 1—see FIG. 4). This increase in wear is due, above all, to three main factors: the process of manufacturing the ring, the mechanical loading of the engine and the thermal conditions imposed to the ring during the operation of the engine.

Considering that at present the engines undergo higher demands in terms of environmental impact and of output, all the engine components should perform their functions, but in a more demanding manner due to either a more severe working condition or a lower level of final damage accumulated on the components after operation, in this context the piston rings are no exception. In this regard, it is necessary to prolong the useful life of the piston ring, more particularly in the end regions. This wear is particularly more marked on heavy duty Diesel engines (HDD).

One of the surface treatment operations used in the prior art to impart greater surface resistance to these parts is the physical vapor deposition process, capable of depositing, for instance, a chrome nitride layer of about 30 microns throughout the peripheral surface that contacts the cylinder, including the end regions 4' of the ring 10'.

One of the prior-art proposals that try to solve the problem of wear of piston-ring ends is presented in document US 2004056425, which describes a low-cost ring-manufacture method and which provides a countermeasure for the wear of the ends. In this technology, a film is deposited onto the outer surface or slide surface, where the film thickness in the end region (vertex) is larger than in the adjacent region (see FIG. 1). The coating can be applied either by physical vapor deposition (PVD/DFV) or by chemical vapor deposition (CVP/DQV), wherein the end region is exposed longer than the rest of the ring in order to guarantee a larger coating thickness at the ends.

However, it should be noted that the PVD/CVD processes exhibit a great limitation with respect to the final thickness of the coating. Usually, the thickness is not larger than 30 microns, although there are a few cases that make reference to coatings with larger thickness. Anyway, thicker coatings will have a poor performance, since the coating undergoes an increase in tension as a result of the thickness and also loses properties of the material of the layer, which impairs the resistance to wear when one obtains layers with thickness larger than 30 cm. Moreover, although the document mentions a low cost of the process employed, it is known that PVD/CVD processes are quite expensive, and it is natural that the larger the thickness the greater the impact on the final price.

Other attempts were also made to solve the problem of excessive wear in the end region of piston rings. Such solutions can be found in documents JP2000120866, DE102008035148, US2010090416 and US200204107, which mention geometric relations implemented with a view to diminish the contact pressure area in the end portion of the piston ring during the working conditions, these solutions being considered capable of decreasing wear in said end regions of piston rings.

Although this theory seems to have a reasonable technical basis, it is known that such an approach does not solve the problem of high wear at the ring ends. In other words, the solution of exposing the base material of the ring with a PVD/CVD coating is the solution that makes use of the geometric approach.

Thus, the present invention indicates a new direction toward coating the end regions with a layer of a determined thickness deposited onto another.

SUMMARY

Therefore, an objective of the present invention is to provide a compression ring that will resist wear in the slide region of the ring ends so as to prevent exposure of the base material that exposes the piston ring.

It is also an objective of the present invention to provide a piston ring with a metallic steel base comprising a layer having high resistance to wear, which is generated by a thermal spray method in the end regions of a ring, while another layer of chrome nitride generated by PVC is deposited subsequently.

It is a further objective of the present invention to provide a ring as set forth above at a competitive cost.

The objectives of the present invention are achieved by providing a piston ring having a metallic base to which an outer slide layer is associated, an intermediate layer being positioned between the base and the outer layer, the outer layer and the intermediate layer being exclusively present on the outer radial face of each end region of the ring.

BRIEF DESCRIPTION OF THE DRAWINGS

The present invention will now be described in greater detail with reference to embodiments represented in the drawings. The figures show.

DETAILED DESCRIPTION

The present invention proposes a piston ring 10 for internal combustion engine, more particularly a compression ring for heavy duty Diesel engines.

As it is known, such engines are quite demanding, which causes premature failure of their compression rings, due to the high wear in the rind-end regions. The present invention proposes a novel compression ring 10 that is capable of resisting wear in the end regions 4, without exposing the base material of the ring, thus maintaining high shapability at a reduced cost.

To this end, the ring 10 of the present invention makes use of a metallic base (of steel, cast iron or aluminum) provided with a chemical composition particularly developed for application of an intermediate layer 2, layer of wear-resistant material, preferably chrome nitride, but not limited to this material, this intermediate layer being applied by the thermal spray process, preferably by a high-velocity spray containing, as carburant, oxygen (HVOF), wherein an outer layer 3 is applied onto this intermediate layer 2 by physical vapor deposition (PVD), preferably of CrN, but not limited only to this material, alternatives of other nitrides, for example, Ti, W, or even carbides may be used as a final coating material of the contact surface of the rings. One may also use coatings with multi-layer concepts, either involving nanometric concepts or not.

Figure 1:
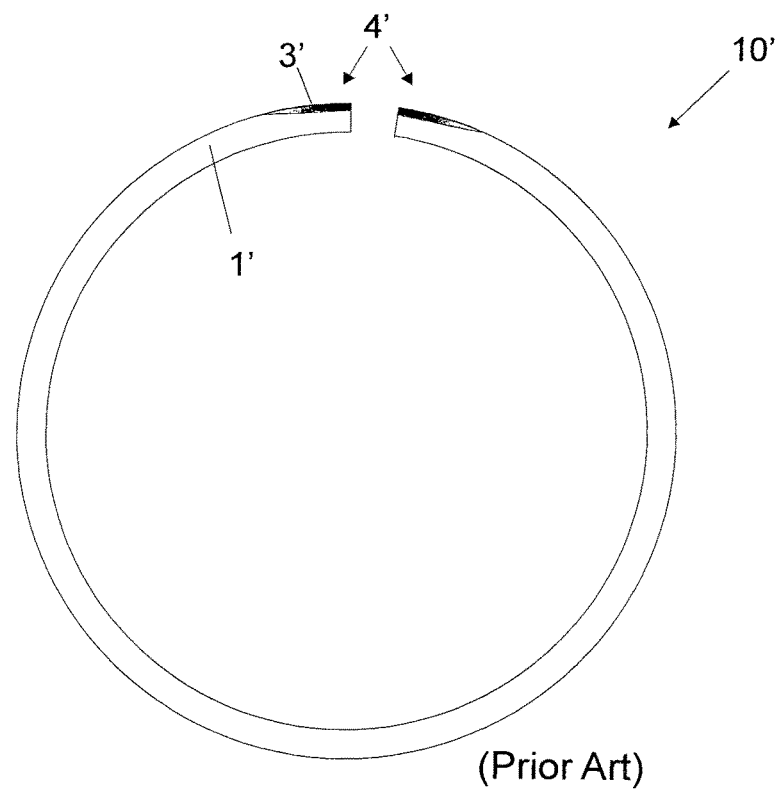
FIG. 1 is a prior-art piston ring.
Figure 2:
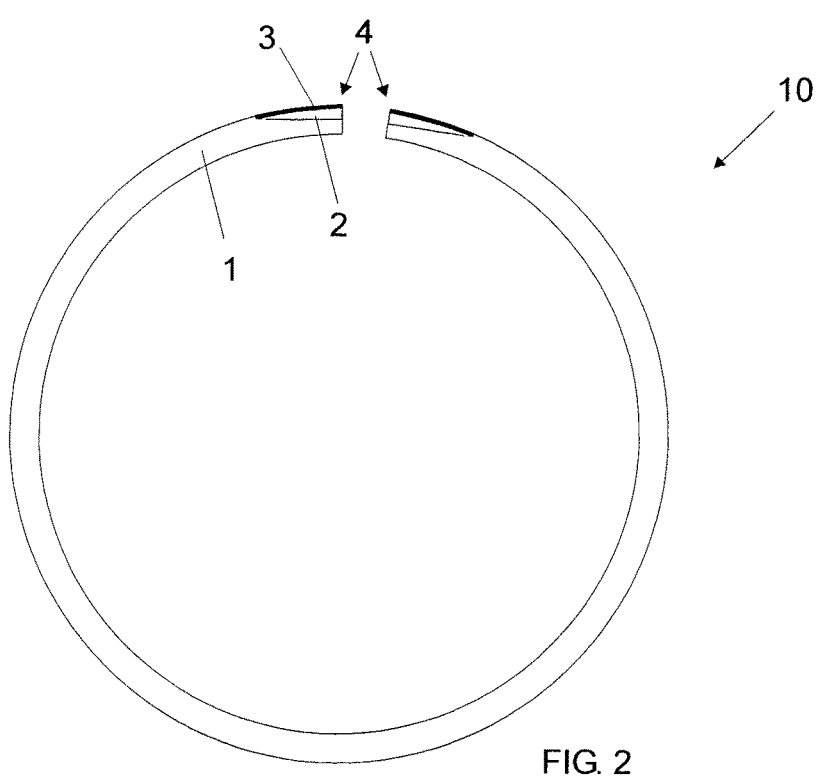
FIG. 2 is a piston ring of the present invention.
Figure 3:
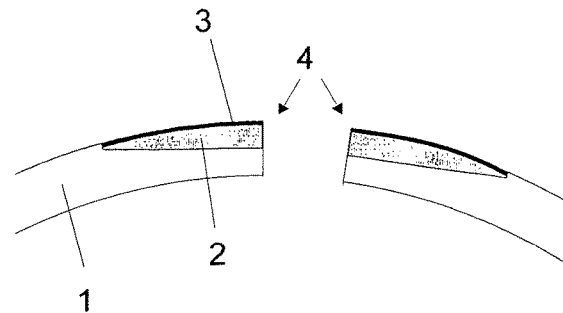
FIG. 3 is a detail of a piston ring of the present invention.
Figure 4:
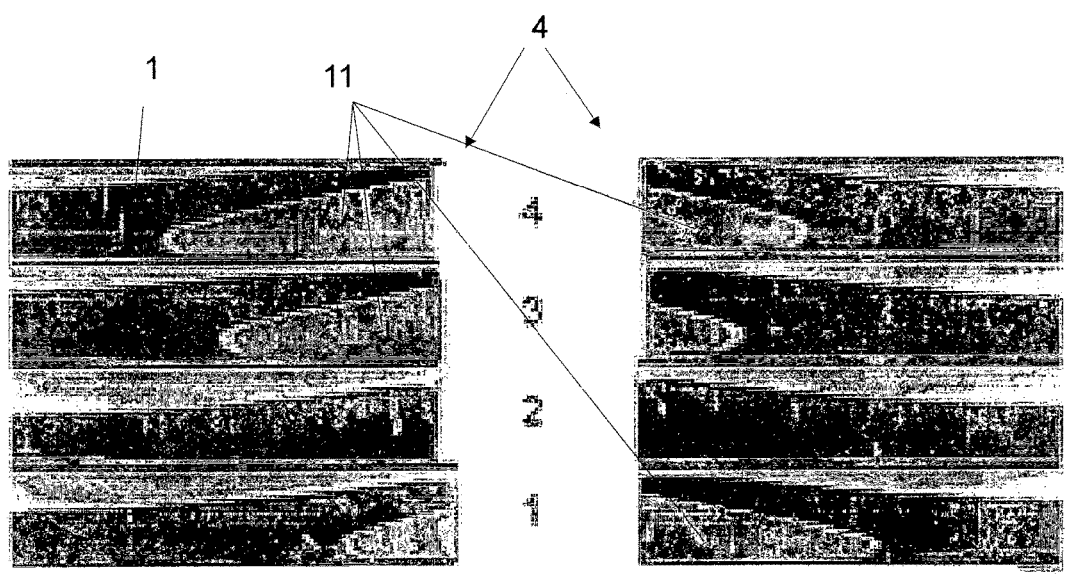
FIG. 4 is an example of the wear of prior-art piston rings in the end region of the rings.

For a better understanding, see FIGS. 2 and 3. Such coatings are applied onto the outer radial face of each end regions 4 of the piston ring 10. For this purpose, the portion that will receive the coatings is chamfered or pared so that, after application of the coating, the ring size will not alter significantly.

After application of the layer located at the ends of the piston ring, one may apply a finish method, as for instance grinding, with a view to providing an adequate condition of the surface, be it because of the shape of the ring ends or due to a criterion of surface roughness. Only after the end regions have been properly finished will the final coating be applied.

The great advantage of the present invention is that of not applying a very thick PVD layer, which would generate too high tensions in the coating and an excessive cost. So, one employs a process that enables deposition of material having good resistance to wear onto the end regions of the piston ring with thickness sufficient to prevent exposure of the base material, even for very severe working conditions, this intermediate layer being highly compatible (good adhesion) with the outer PVD layer. In this way, internal tensions are reduced, the thickness of the coating at the ends 4 of the ring 10 is enlarged, the cost of manufacturing the ring 0 is reduced, and better functioning condition for the component is achieved. It should be noted that, due to the high wear on the prior-art rings, the base material of the ring has low resistance to wear and, when it undergoes stress as a tribologic surface, it does not exhibit good compatibility, which leads to high wear and deterioration of the functionality of good gas sealing of the combustion chamber which the piston ring should have.

In this way, if the outer coating 3 is totally consumed, it maintains the intermediate coating 2, which also prevents wear of the piston ring 10. This constructive embodiment is of great advantage, since the market does not accept willingly the possibility of a base material 1 being directly exposed to the cylinder body when the PVD coating is consumed. In this way, one prevents the problems, besides the high wear mentioned before, and the prior-art component remains vulnerable to stoppage due to direct contact between the base 1 material and the slide surface of a cylinder.

The present invention has, as a particularity, the fact that it would not possible to achieve the results of the present invention without application of an intermediate layer by thermal spray. The thermal spray process including the HVOF has the advantage that, besides having resistance to wear similar to a coating deposited by PVD, it enables a localized deposition of material only in the region where greater resistance to wear is required (ends 4 of the ring 10), which cannot be achieved by other processes, such as galvanic chroming. Moreover, the HVOF process enables one to deposit larger thicknesses without increasing the internal tensions of the coating.

Preferred examples of embodiments having been described, one should understand that the scope of the present invention embraces other possible variations, being limited only by the contents of the accompanying claims, which include the possible equivalents.

The invention claimed is:

1. A piston ring, comprising:
a metallic base, an outer slide layer, and an intermediate layer disposed between the base and the outer slide layer;
wherein the base extends between at least two end regions, each of the at least two end regions having a chamfer extending radially inward from an outer radial face of the respective end region;
wherein the outer slide layer and the intermediate layer are disposed exclusively on the chamfer of each end region of the base;
wherein a radial thickness of the intermediate layer increases towards the outer radial faces such that a radial thickness in the at least two end regions and a radial thickness of the metallic base between the at least two end regions are the same.

2. The piston ring according to claim 1, wherein the intermediate layer includes a thermally dispersed wear-resistant material.

3. The piston ring according to claim 2, wherein the thermally dispersed wear-resistant material includes a hypersonic thermally dispersed composition of chrome nitride.

4. The piston ring according to claim 3, wherein the outer slide layer includes a physically vaporized composition of chrome nitride disposed on the intermediate layer.

5. The piston ring according to claim 2, wherein the outer slide layer includes a physically vaporized composition of chrome nitride disposed on the intermediate layer.

6. The piston ring according to claim 1, wherein the outer slide layer includes a physically vaporized composition of chrome nitride disposed on the intermediate layer.

7. The piston ring according to claim 1, wherein the piston ring is configured as at least one of a compression ring and an oil-scraping ring.

8. The piston ring according to claim 1, wherein the base includes at least one of a steel material, a cast iron material and an aluminum material.

9. The piston ring according to claim 1, wherein the base together with the intermediate layer and the outer slide layer at the at least two end regions has a radial extent corresponding to a radial extent of the base in a region circumferentially spaced away from the at least two end regions.

10. The piston ring according to claim 1, wherein the outer slide layer includes at least one of titanium nitride and tungsten nitride.

11. An internal combustion engine, comprising:
a piston ring including:
a metallic base extending circumferentially between at least two circumferential end regions with respect to a reciprocating axis, the base including an outer radial face and an inner radial face with respect to the axis;
an outer slide layer and an intermediate layer disposed between the outer slide layer and the base;
wherein the at least two end regions each includes a chamfer extending radially inwards from the outer radial face;
wherein the outer slide layer and the intermediate layer are disposed exclusively on the chamfer of each of the at least two end regions; and
wherein a radial thickness of the intermediate layer increases towards the outer radial faces such that a radial thickness of the ring in the at least two end regions is significantly the same as a radial thickness of the metallic base between the at least two end regions.

12. The internal combustion engine according to claim 11, wherein the intermediate layer includes a thermally dispersed wear-resistant material.

13. The internal combustion engine according to claim 12, wherein the thermally dispersed wear-resistant material includes a hypersonic thermally dispersed composition of chrome nitride.

14. The internal combustion engine according to claim 11, wherein the outer slide layer includes a physically vaporized composition of chrome nitride disposed on the intermediate layer.

15. The internal combustion engine according to claim 11, wherein the base includes at least one of a steel material, a cast iron material and an aluminum material.

16. The internal combustion engine according to claim 11, wherein the internal combustion engine is one of a diesel engine, an Otto engine, a two stroke engine and a three stroke engine.

17. The internal combustion engine according to claim 11, wherein the piston ring is at least one of a compression ring and an oil-scraping ring.

18. A piston ring for an internal combustion engine, comprising:
a metallic base extending circumferentially between at least two circumferential end regions with respect to a reciprocating axis, the base including an outer radial face and an inner radial face with respect to the axis, wherein the at least two end regions each include a chamfer extending radially inwards from the outer radial face;
an outer slide layer and an intermediate layer disposed between the outer slide layer and the base, wherein the intermediate layer includes a thermally dispersed wear-resistant material and the outer slide layer includes a physically vaporized material disposed on the intermediate layer;
wherein the outer slide layer and the intermediate layer are disposed exclusively on the outer radial face of the chamfer of each of the at least two end regions such that a radial thickness of the ring in the at least two end regions is significantly the same as a radial thickness of the metallic base between the at least two end regions.

* * * * *